United States Patent
Yang

(10) Patent No.: US 7,934,936 B2
(45) Date of Patent: May 3, 2011

(54) ELECTRICAL CONNECTOR

(75) Inventor: Yong Teck Yang, Singapore (SG)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/440,805

(22) PCT Filed: Sep. 10, 2007

(86) PCT No.: PCT/US2007/019643
§ 371 (c)(1),
(2), (4) Date: Nov. 17, 2009

(87) PCT Pub. No.: WO2008/033295
PCT Pub. Date: Mar. 20, 2008

(65) Prior Publication Data
US 2010/0062647 A1    Mar. 11, 2010

(51) Int. Cl.
*H01R 13/62* (2006.01)
(52) U.S. Cl. ....................................................... 439/157
(58) Field of Classification Search .................. 439/160, 439/157
See application file for complete search history.

(56) References Cited

U.S. PATENT DOCUMENTS

| 4,781,612 A | 11/1988 | Thrush |
| 4,842,538 A | 6/1989 | Noschese |
| 5,468,156 A | 11/1995 | Flinchbaugh et al. |
| 6,074,232 A | 6/2000 | Choy et al. |
| 7,789,681 B2 * | 9/2010 | Guan et al. .................... 439/157 |

* cited by examiner

*Primary Examiner* — Gary F. Paumen
(74) *Attorney, Agent, or Firm* — Stephen L. Sheldon

(57) ABSTRACT

An electrical connector (1) for receiving a daughter card having a plurality of conductive surfaces is described. The connector has an elongated housing (5) having a slot (8) for receiving the daughter card; the slot has electrical terminals (9) for engaging the plurality of conductive surfaces on the daughter card and for electrically connecting the daughter card to the connector. An arm (6, 7) extends from at least one end of the elongated housing; a latch (3, 4) is pivotally connected to the arm. The latch is pivotal about an axis substantially parallel to a longitudinal axis (401) of the housing; the latch is rotatable between a first position at which the daughter card is retained within the elongated slot and a second position at which the daughter card is unrestrained. The longitudinal axis of the connector is not increased when the latch is in the second position.

13 Claims, 6 Drawing Sheets

X —— 101

Y —— 201

ELECTRICAL CONNECTOR

This application is a national phase application of PCT/US07/19643 filed on Sep. 10, 2007, which in turn claims the benefit of priority of Singapore application No. 200606262-4, filed Sep. 11, 2006.

FIELD OF THE INVENTION

The present invention relates to an electrical connector. More particularly but not exclusively it relates to an electrical connector adapted for receiving a daughter card or the like.

BACKGROUND OF THE INVENTION

Electrical connectors for daughter cards are used in various electronic devices including routers, switches, servers, and networking equipment. FIG. 1 illustrates a typical electrical connector with an inserted daughter card. The electrical connector in FIG. 1 has an elongated housing with a slot for receiving a daughter card. The daughter card is held in place via two latches at the two ends of the housing. There are projections on the latches for engaging with corresponding notches on the daughter card to secure or retain the daughter card. To remove the daughter card from the connector, the latches are opened to disengage the projections on the latches from the notches on the daughter card as shown in FIG. 2. In this opened position, the overall longitudinal length of the connector increases relative to the closed position, i.e. length Y 201 is greater than length X 101. This in turn increases the estate area required by the connector. With the shift to smaller electronic devices reducing the space required is desirable. As illustrated in FIG. 3 the longitudinal length Z 301 of the connector of the present invention is shorter than even the closed position longitudinal length X 101 of the prior art connectors.

SUMMARY OF THE INVENTION

It is therefore an object of the present invention to provide an electrical connector that overcomes or at least ameliorates some of the abovementioned disadvantages or which at least provides the public or industry with a useful choice.

Other objects of the invention may become apparent from the following description which is given by way of example only.

According to the invention there is provided an electrical connector for receiving a daughter card having a plurality of conductive surfaces, said electrical connector comprising:

an elongated housing having a slot for receiving, said daughter card, said slot having electrical terminals for engaging said plurality of conductive surfaces on said daughter card and for electrically connecting said daughter card to said connector;

an arm extending from at least one end of said elongated housing; and a latch pivotally connected to said arms, said latch pivotal about an axis substantially parallel to a longitudinal axis of said housing, said latch rotatable between a first position at which said daughter card is retained within said elongated slot and a second position at which said daughter card is unrestrained, wherein the longitudinal axis of said connector is not increased when said latch is in said second position.

The latch preferably has a has a retaining finger at a first end, said retaining finger engageable in a corresponding notch of said daughter card in said first position.

The latch preferably further has an ejection lever at the opposite end of said latch to said retaining finger, said ejection lever usable to move said latch from said first position to said second position.

The arm preferably further has a latch pivot limiter having first and second pivot limiting surfaces, said pivot limiting surfaces being substantially perpendicular to each other, said first pivot limiting surface limiting the movement of said latch when pivoted to said first position and said second pivot limiting surface limiting the movement of said latch when pivoted to said second position.

The latch preferably further has an ejection member adapted to push said daughter card from said slot when said latch is moved from said first to said second position.

A detent is preferably included on at least one side of said latch to retain the latch in said first position.

A protuberance is preferably provided on each side of each said latch, said protuberance is engageable with holes on each said arm to form the pivot axis.

Each end of said elongated slot preferably has an arm having a latch pivotally connected.

The daughter card is a preferably a memory module.

Other aspects of the invention may become apparent from the following description which is given by way of example only and with reference to the accompanying drawings.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE DISCLOSED EMBODIMENTS

Figure 1:
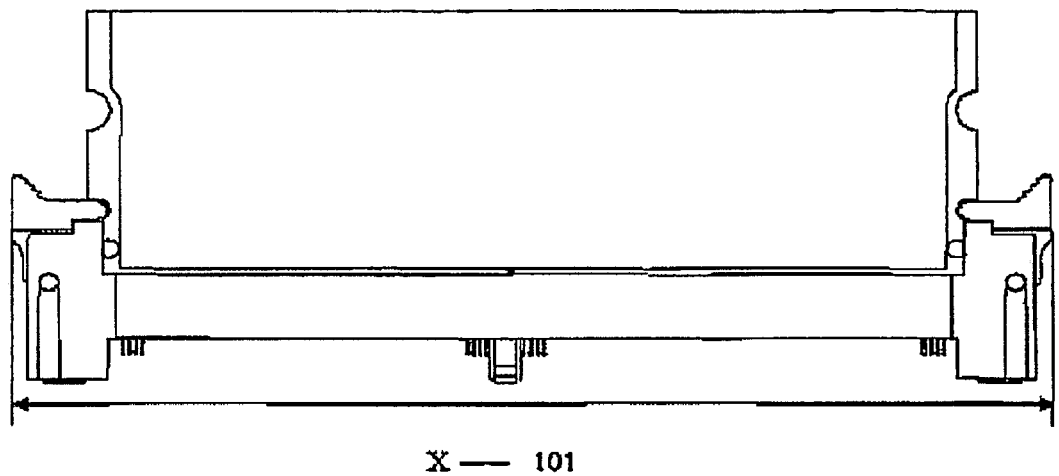
FIG. 1 is a front view of a connector in a closed position with a daughter card inserted according to the prior art.
Figure 2:
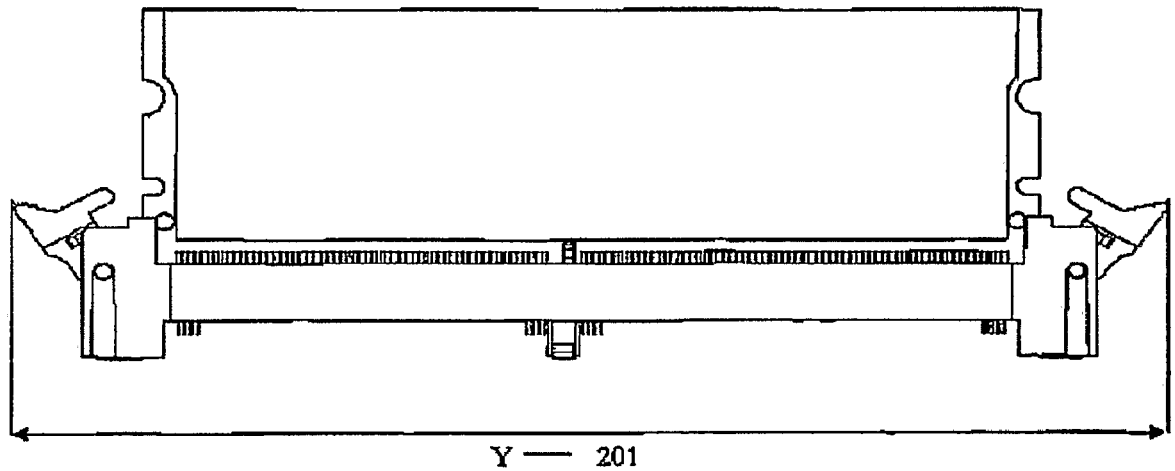
FIG. 2 is a front view of a connector in an opened position according to the prior art.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated.

The term "comprising" as used in this specification and claims means "consisting at least in part of". When interpreting statements in this specification and claims which include that term, the features, prefaced by that term in each statement, all need to be present but other features can also be present. Related terms such as "comprise" and "comprised" are to be interpreted in the same manner.

Figure 3:
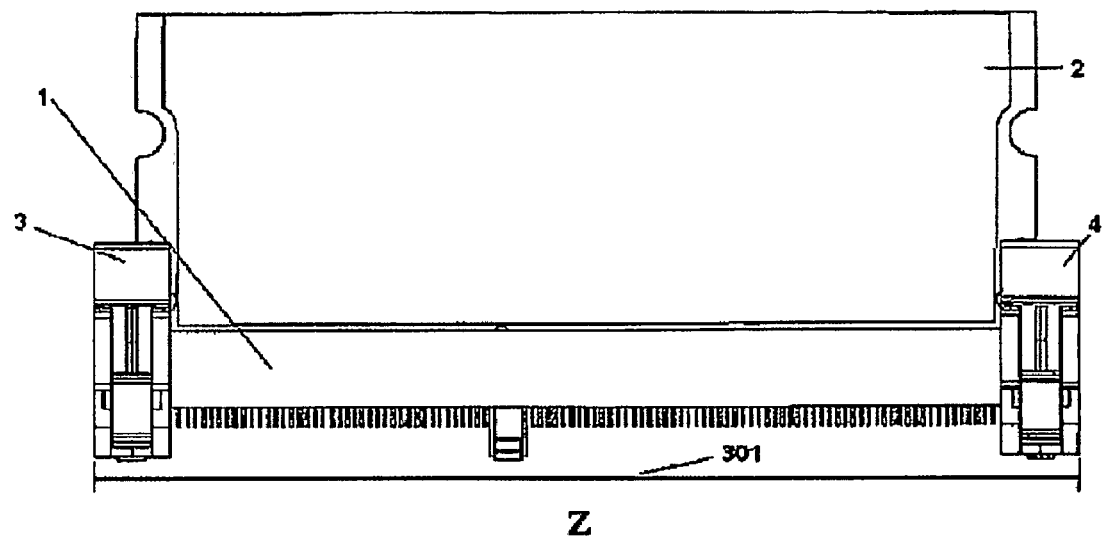
FIG. 3 is a front view of a connector with a daughter card inserted.

FIG. 3 illustrates the front view of an exemplary embodiment of the invention. An electrical connector 1 has a daughter card 2 inserted. When the connector 1 of the present invention is used for mounting a daughter card 2 substantially parallel to a main board, FIG. 3 may then be seen as the top view of the connector. The connector 1 is advantageous when connecting a daughter card 2 parallel or perpendicular to a main board.

The overall longitudinal length Z 301 of the connector 1 does not change when the latches 3, 4 are moved from a first closed or retained position to a second open or unrestrained position. The latches 3, 4 pivot on an axis substantially parallel to the longitudinal axis of the connector. The workings of the latches will be described in more detail below.

Figure 4:
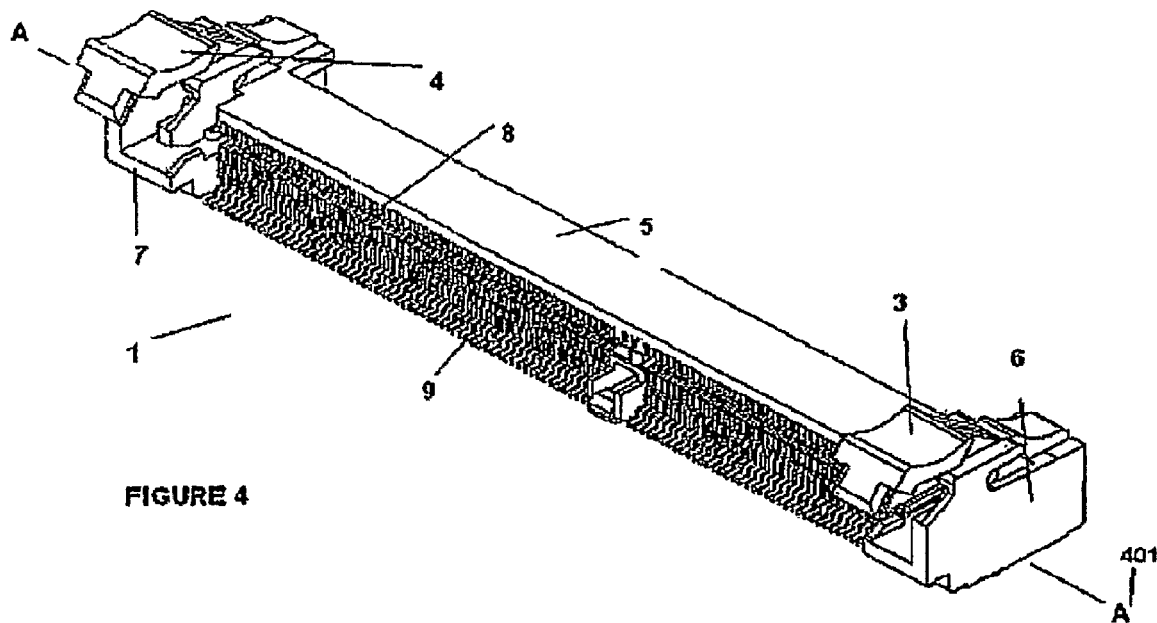
FIG. 4 is a perspective view of the connector in an eject position without a daughter card.

With reference to FIG. 4, the electrical connector 1 has an elongated insulated housing 5 with a pair of arms 6, 7 extending from opposite ends of the housing 5. The latches 3, 4 are releasably and pivotally connected to the arms 6, 7. The latches 3, 4 pivot about an axis parallel to the longitudinal axis A-A 401 of the housing 5. A slot 8 is disposed within the housing 5 to allow a daughter card 2 to be inserted. A plurality of electrical contacts 9 are located in the slot 8 to electrically connect with an inserted daughter card 2.

Figure 5:
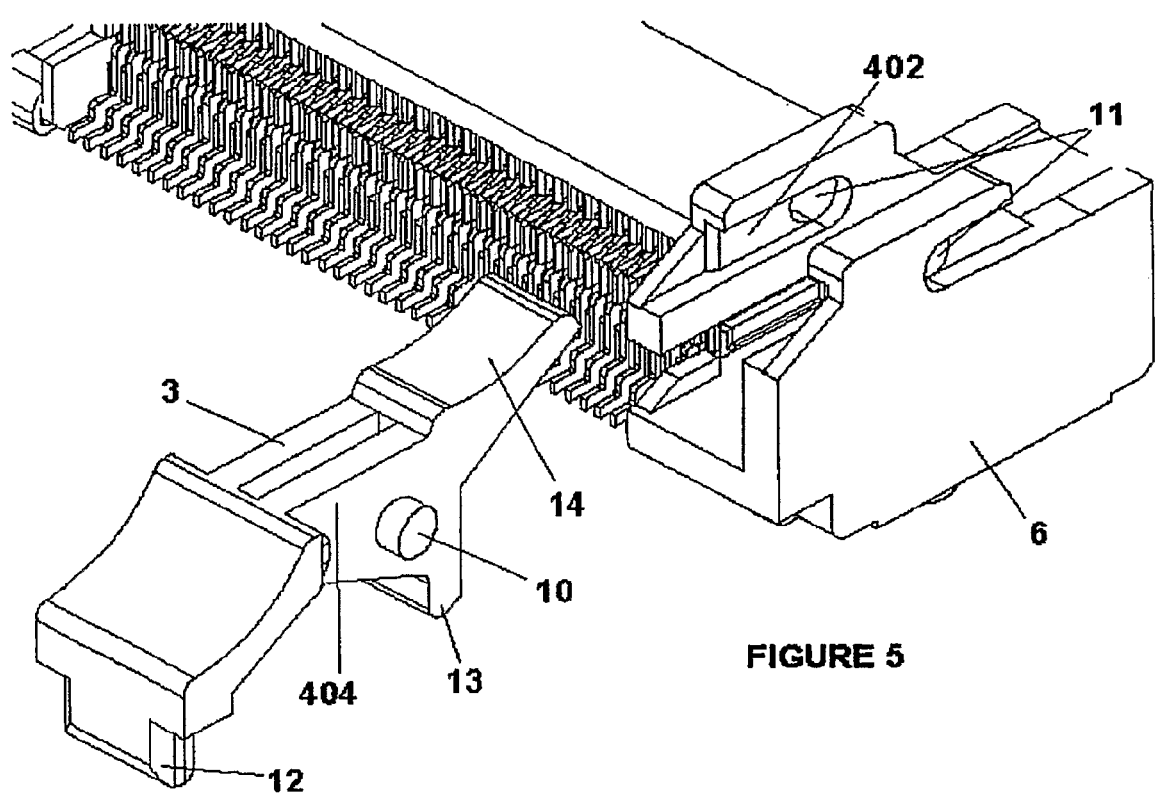
FIG. 5 is an exploded and close up view of the connector in FIG. 4.

FIG. 5 shows a close up and exploded view a latch 3 and arm 6. The latch 3 has protuberances 10 on either side of the latch 3 (only shown on one side in FIG. 5). These protuberances 10 snap fit into corresponding holes 11 in the arm 6. To enable assembly slots 402 guide the protuberances 10 into the holes 11. The protuberances 10 and the holes 11 form the axis from which the latch 3 pivots.

Alternatively the pivot axis may be formed by a rod connecting the two holes 11. The rod may be moulded when the connector 1 is manufactured. A complementary channel in the latch 3 may be snapped onto the horizontal bar allowing the latch to pivot.

The latch 3 has a retaining finger 12 projecting from the main body 404 of the latch 3 and an ejection lever 14 extending from the main body 404 of the latch in the opposite direction. An ejection member 13 extends from the body between the retaining finger 12 and the ejection lever 14.

Figure 6:
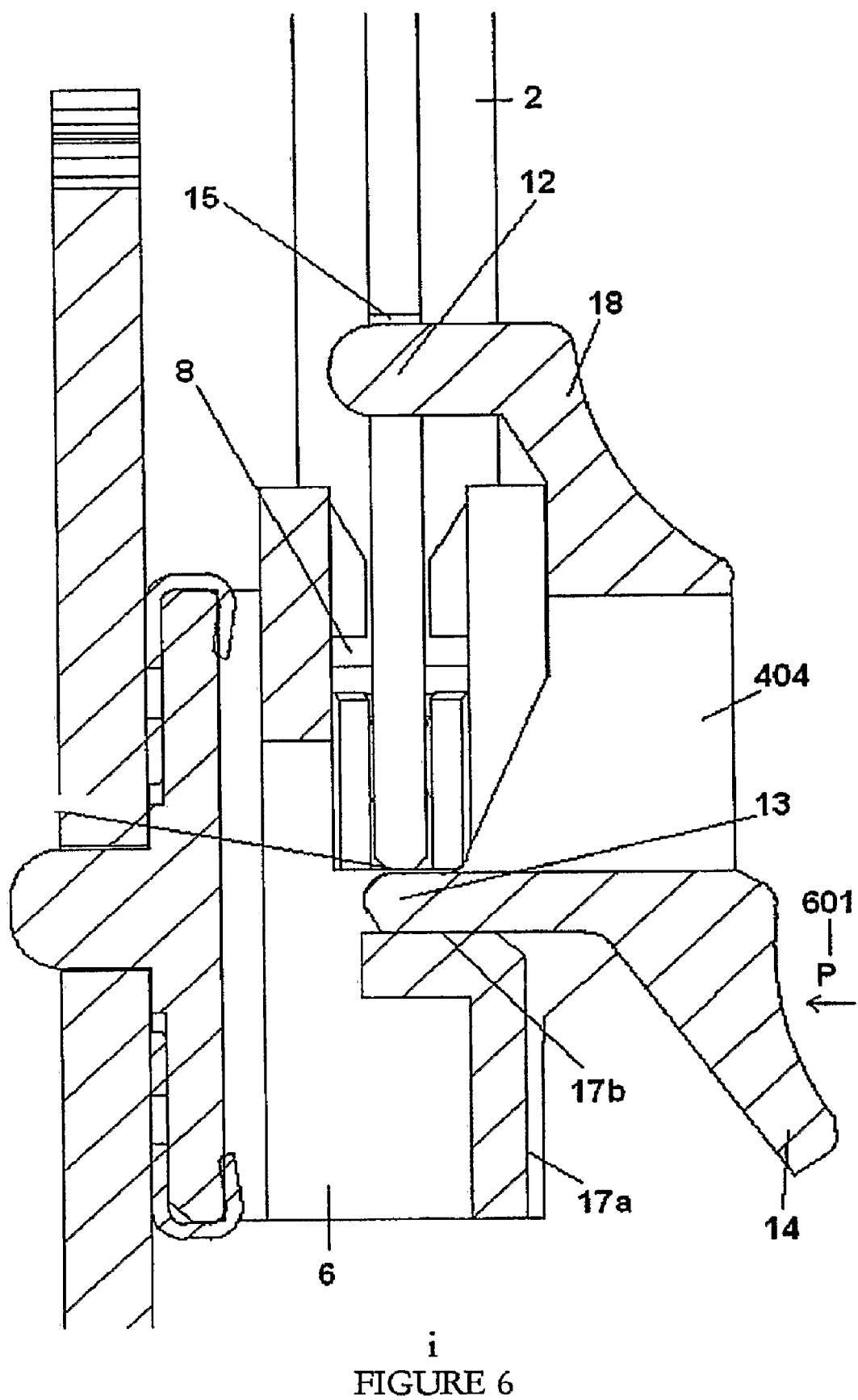
FIG. 6 is cross sectional view of the connector in a locked position.

FIG. 6 shows the latch 3 in the first retaining position. The retaining forger 12 is engaged with a corresponding notch 15 on the daughter card 2. This assists in retaining the daughter card 2 in the slot 8 of the electrical connector 1. In this position, the bottom edge 16 of the daughter card 2 is sitting on the ejection member 13.

A latch pivot limiter has first 17b and second 17a surfaces that limit the pivoting movement of the latch 3 in the retained and unrestrained positions respectively of the pivot. The latch pivot limiting surfaces 17a, 17b are in general perpendicular to each other.

Figure 7:
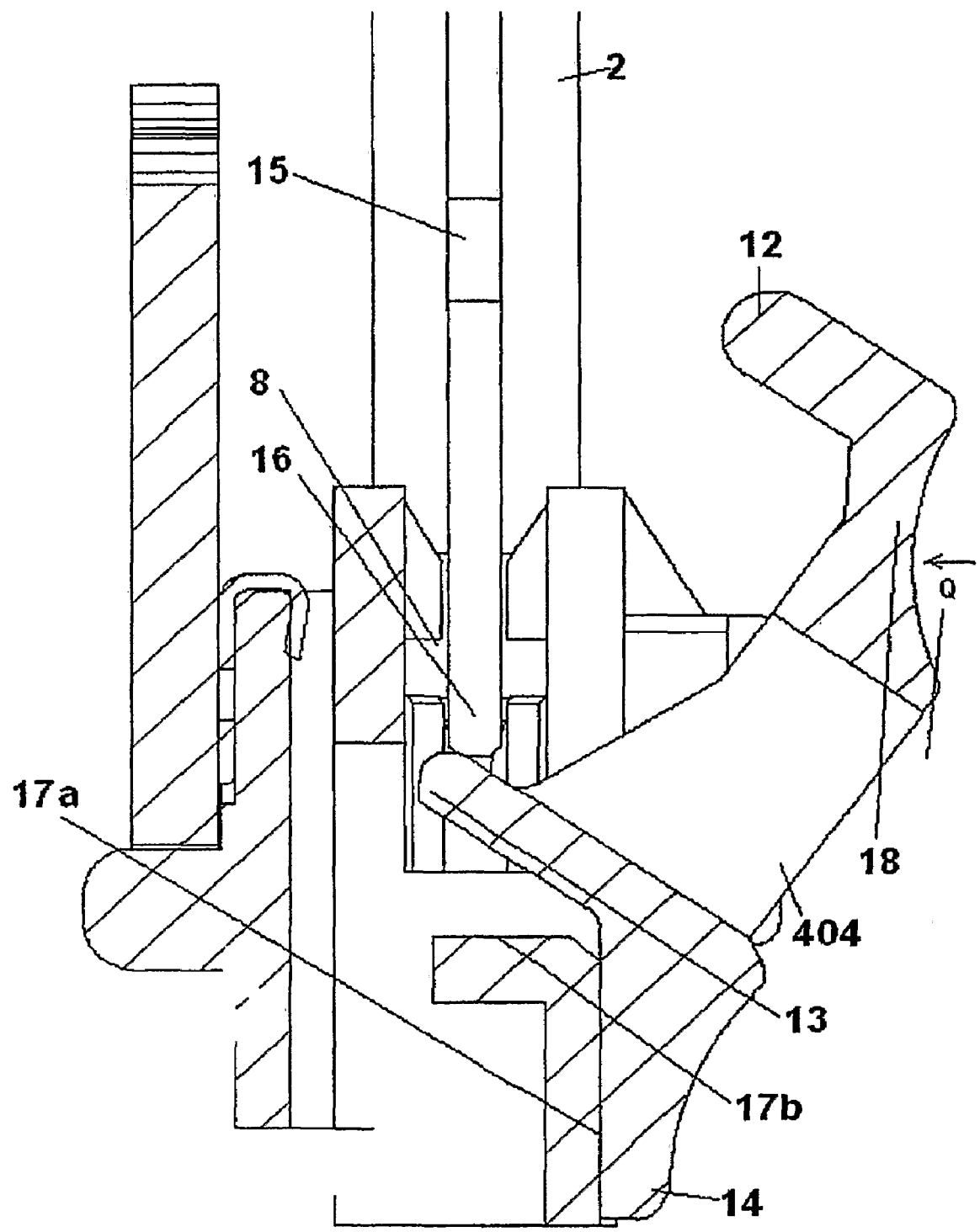
FIG. 7 is a cross sectional view of the connector in an eject position.

To release the daughter card 2 from the slot 8, the ejection lever 14 is pushed towards the arm 6 in the direction P 601. With reference to FIG. 7, upon pushing the ejection lever 14, the retaining finger 12 disengages from the notch 15. At the same time, the movement causes the ejection member 13 to push the bottom edge 16 of the daughter card 2, ejecting the daughter card 2 from the slot 8. Further pivoting of the latch 3 is restricted by the second surface of the latch pivot limiter 17a abutting the ejection lever 14.

To lock or retain the daughter card 2 in the slot 8, the top portion 18 of the retaining finger 12 may be pushed towards the daughter card 2 in the direction Q 701. The first surface 17b of the latch pivot limiter prevents over pivoting the latch 3 by abutting the ejection member 13.

Figure 8:
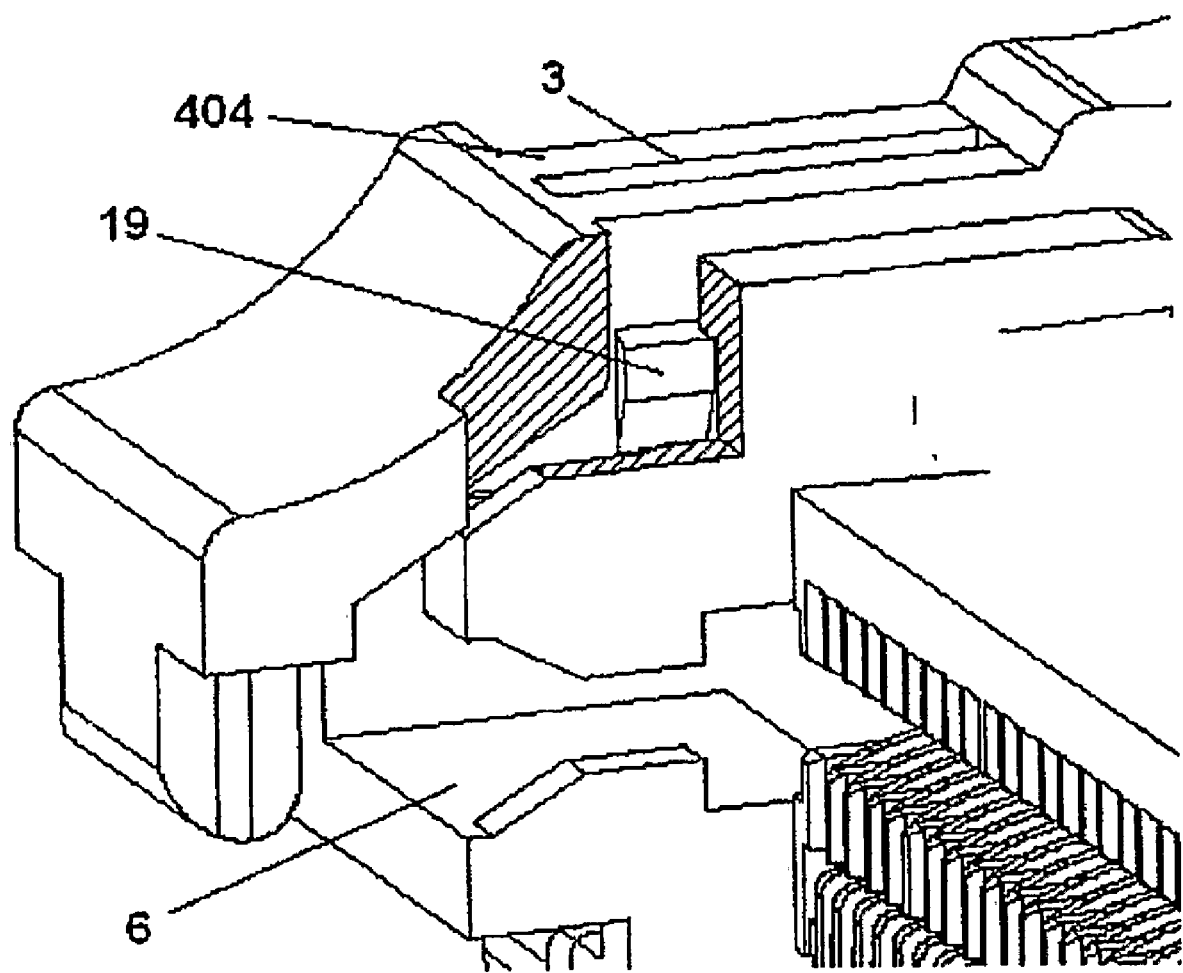
FIG. 8 is a perspective view of the connector showing a detent.

With reference to FIG. 8, a detent 19 may be provided on a side of the latch 3 to offer frictional restriction between the latch 3 and arm 6 when the latch is in a first position.

The connector 1 may be made of a moulded resilient plastic; the latches 3, 4 are moulded separately and the connector is assembled. It is to be understood that the scope of the invention is not limited to the described embodiments and therefore that numerous variations and modifications may be made to these embodiments without departing from the scope of the invention as set out in the claims.

While a preferred embodiment of the invention is shown and described, it is envisioned that those skilled in the art may devise various modifications without departing from the spirit and scope of the foregoing description and the appended claims.

What is claimed is:

1. An electrical connector, comprising:
an elongated housing having a slot configured to receive a daughter card having a plurality of conductive surface, the slot having electrical terminals configured, in operation, to engage the plurality of conductive surfaces on the daughter card and further configured, in operation, to electrically connect the daughter card to the connector;
an arm extending from at least one end of the elongated housing; and
a latch pivotally connected to the arm, the latch pivotal about an axis substantially parallel to a longitudinal axis of the housing, the latch rotatable between a first position configured, in operation, to retain the daughter card within the elongated slot and a second position configured, in operation, to leave the daughter card unrestrained,
wherein the longitudinal axis of the connector is not increased when said latch is in said second position and the latch has a retaining finger at a first end, the retaining finger configured to engage a corresponding notch of the daughter card in the first position and the latch further has an ejection lever at a second end of the latch, the second end opposite the first end, the ejection lever usable to move the latch from the first position to the second position.

2. The electrical connector of claim 1 wherein, the arm has a latch pivot limiter having first and second pivot limiting surfaces, the pivot limiting surfaces being substantially perpendicular to each other, the first pivot limiting surface limiting the movement of the latch when pivoted to the first position and the second pivot limiting surface limiting the movement of the latch when pivoted to the second position.

3. The electrical connector of claim 2 wherein, the latch further has an ejection member adapted to push the daughter card from the slot when the latch is moved from the first to the second position.

4. The electrical connector of claim 1 wherein, the latch further has an ejection member adapted to push the daughter card from the slot when the latch is moved from the first to the said second position.

5. The electrical connector of claim 4 wherein, the arms include holes and a protuberance is provided on each side of the latch, the protuberance engaging the holes so as to form the pivot axis.

6. The electrical connector of claim 1 wherein, the arms include holes and a protuberance is provided on each side of the latch, the protuberance engaging the holes so as to form the pivot axis.

7. The electrical connector of claim 5 wherein, the latch includes a detent on at least one side to retain the latch in the first position.

8. The electrical connector of claim 7 wherein, each end of the elongated slot has an arm having a latch pivotally connected.

9. The electrical connector of claim 6 wherein, each end of the elongated slot has an arm having a latch pivotally connected.

10. The electrical connector of claim 4 wherein, each end of the elongated slot has an arm having a latch pivotally connected.

11. The electrical connector of claim 2 wherein, each end of the elongated slot has an arm having a latch pivotally connected.

12. The electrical connector of claim 1 wherein each end of the elongated slot has an arm having a latch pivotally connected.

13. The electrical connector of claim 1 wherein, the connector is configured to receive a daughter card that is a memory module.

* * * * *